United States Patent [19]

Yamanouchi

[11] Patent Number: 5,926,397
[45] Date of Patent: Jul. 20, 1999

[54] ROUTING DESIGN METHOD AND ROUTING DESIGN APPARATUS

[75] Inventor: Takayuki Yamanouchi, Yamatokoriyama, Japan

[73] Assignee: Sharp Kabushiki Kaisha, Osaka, Japan

[21] Appl. No.: 08/810,446

[22] Filed: Mar. 4, 1997

[30] Foreign Application Priority Data

Mar. 6, 1996 [JP] Japan ................................ 8-049295

[51] Int. Cl.⁶ ............................................ G06F 17/50
[52] U.S. Cl. ................................................ 364/491
[58] Field of Search .................... 364/488–491, 364/578

[56] References Cited

U.S. PATENT DOCUMENTS

| | | | |
|---|---|---|---|
| 5,367,469 | 11/1994 | Hartoog | 364/491 |
| 5,410,491 | 4/1995 | Minami | 364/491 |
| 5,461,576 | 10/1995 | Tsay et al. | 364/490 |
| 5,475,607 | 12/1995 | Apte et al. | 364/489 |
| 5,564,022 | 10/1996 | Debnath et al. | 395/250 |
| 5,638,291 | 6/1997 | Li et al. | 364/490 |

FOREIGN PATENT DOCUMENTS

| | | | |
|---|---|---|---|
| 06215071 | 8/1934 | Japan | G06F 15/60 |
| 0608938 | 3/1994 | Japan | H01L 21/82 |
| 06089938 | 3/1994 | Japan | H01L 21/82 |
| 6-215071 | 8/1994 | Japan | G06F 15/60 |

OTHER PUBLICATIONS

Cho et al. ("A buffer distribution algorithm for high–performance clock net optimization", IEEE Transactions on Very Large Scale Integration (VLSI) Systems, vol. 3, No. 1, pp. 84–98, Mar. 1995).

Primary Examiner—Kevin J. Teska
Assistant Examiner—Phallaka Kik
Attorney, Agent, or Firm—Nixon & Vanderhye P.C.

[57] ABSTRACT

A routing design method applied to an integrated circuit such as an LSI includes the steps of (1) placing a cell serving as a source of signals (source cell) and cells serving as destinations of the signals (destination cells), (2) providing a minimum number of relay spots required on paths between the source cell and the destination cells, (3) providing wires on the paths, (4) extracting parasitic components (wire capacitances and wire resistances) of the wires, and (5) determining delay adjusting elements (cells) to be inserted in the relay spots in accordance with the extracted parasitic components, so that each delay adjusting element has a minimum size. The delay adjusting elements thus determined are inserted in the relay spots.

15 Claims, 13 Drawing Sheets

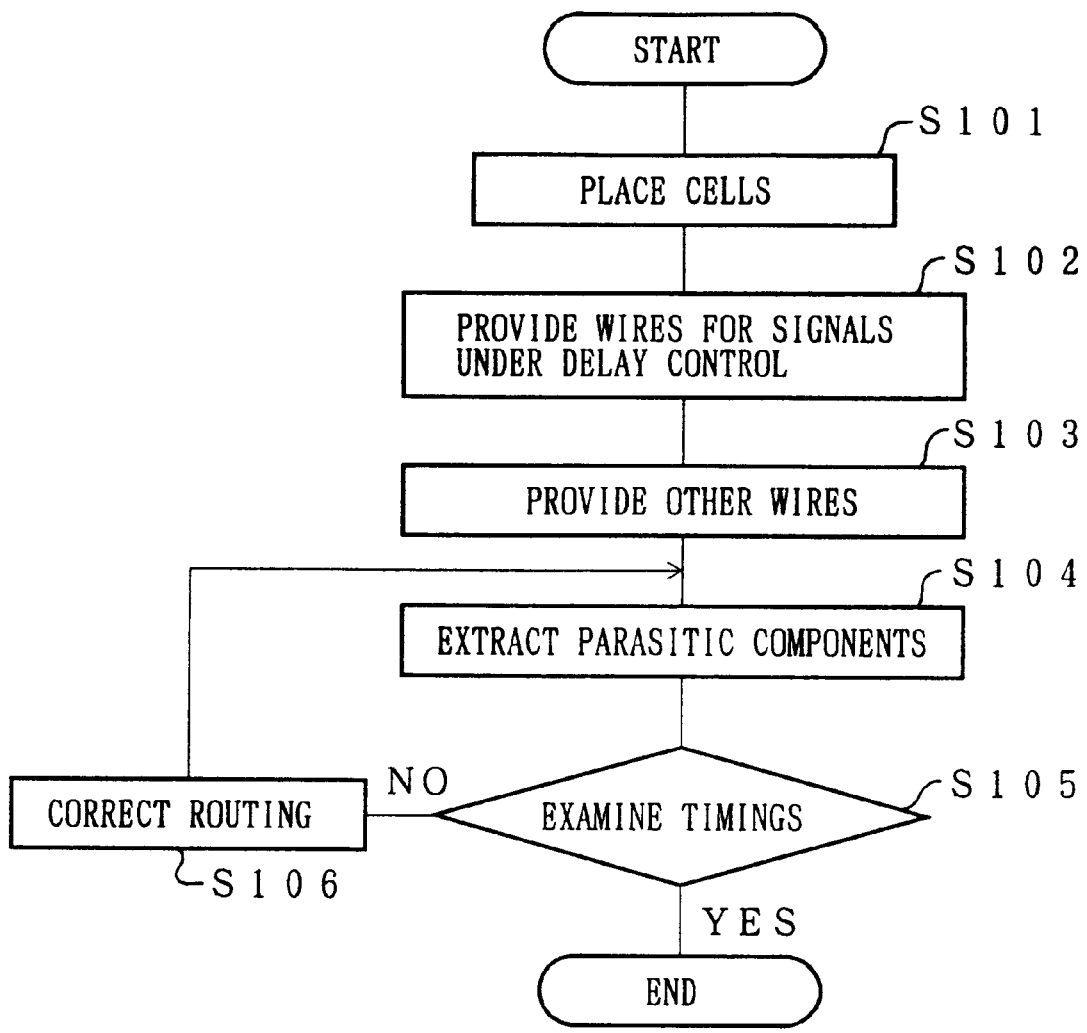

ROUTING DESIGN METHOD AND ROUTING DESIGN APPARATUS

FIELD OF THE INVENTION

The present invention relates to a routing design method and a routing design apparatus capable of controlling signal transmission delays, for the use in designing an electronic circuit component such as a semiconductor integrated circuit, or a printed-wiring board, on which routing is provided.

BACKGROUND OF THE INVENTION

Logical circuits are not capable of high-speed circuit operations unless signal transmission delays are properly controlled. Typical among such problems is a problem of clock skew concerning synchronous circuits. Usually in the synchronous circuit clock signals synchronize operations of a plurality of elements, but in the case where signal supplying paths from a source of a clock signal to respective destinations differ in delays in signal transmission, difference in the delays, that is, the clock skew, causes an operation speed of the circuit to lower, or hinders normal operations of the circuit.

In light of such a problem, the Japanese Publication for Laid-Open Patent Application No. 6-215071/1994 (Tokukaihei No. 6-215071) discloses a clock routing design apparatus which controls wire lengths. As illustrated in FIG. 16, the apparatus determines a route so that wire lengths from a clock driver 101 as a source of the clock signal to respective blocks 102 through 105 as destinations are equal to each other.

On the other hand, the Japanese Publication for Laid-Open Patent Application 6-89938/1994 (Tokukaihei 6-89938) discloses a method for adjusting delays so that differences in delays in signal transmission through the signal supplying paths are absorbed. As illustrated in FIG. 17, an apparatus to which the method is applied includes delay adjusting circuits 117 having driving ability. The adjusting circuits 117 are provided between a clock signal source ill and logical circuits 113 through 116 in a logical circuit section 112, which are destinations of signal supply. According to the method, a plurality of the delay adjusting circuits 117 are prepared, and one delay adjusting circuit 117 with which no difference in the delays occurs is selected among them, based on simulations.

Incidentally, the layout of such circuitry as described above has conventionally been carried out in a procedure illustrated in FIG. 18, for example.

First of all, each cell is placed at each desired position (S101), and then, wires for supplying a signal to which delay adjustment is applied are provided between a signal source and each cell (S102). Subsequently, other wires are provided where necessary (S103), and parasitic components such as wire resistance and wire capacitance are extracted (S104). In addition, signal timings are examined regarding whether or not signal delays are controlled as designed in a state where the routing is completed (S105). Here, in the case where the signal delays are not controlled as designed, the routing is corrected based on the extracted parasitic components (S106), and anew extraction of parasitic components is carried out (S104).

In the routing design by the apparatus disclosed by the former publication wherein the respective wire lengths are set equal, some of the wires are necessarily roundabout wires such as a wire connected to the block 102. Therefore, arises a problem that areas of electronic circuit components expand, or a problem that power consumption increases. Besides, since influences of wire resistances and wire capacitances are great due to further miniaturization of elements in integrated circuits such as LSIs, delays cannot be properly controlled only by setting wire lengths equal, in a delay model wherein the wire resistances and the wire capacitances are to be taken into consideration. Furthermore, in the case where the capacitances of the wires to which signal delay adjustment is applied are caused to change due to influences of the other wires and as a result the delays are caused to change, differences between the delays due to such changes cannot be adjusted.

On the other hand, according to the method disclosed by the latter publication whereby among the prepared delay adjusting circuits 117 an optimal one is selected, influences of the other wires are reflected in the selection. However, the delay adjusting circuits 117 and the logical circuits 113 through 116 are provided in respective areas, thereby causing the wires therebetween to become longer. This causes areas necessary for the routing to expand as well as causes wire capacitances to increase. Since the delay adjusting circuits 117 are required to have higher driving abilities as the wire capacitances increase, the wire capacitances and the delay adjusting circuits 117 both become load capacitances, thereby causing the power consumption to increase.

On top of that, according to the latter method whereby an optimal one is selected among the already-fixed delay adjusting circuits 117, the other delay adjusting circuits 117 which are not selected are wasted. Since a plurality of delay adjusting circuits 117 are provided as multiple choices with respect to each of the logical circuits 113 through 116, the wasted delay adjusting circuits 117 increase as the logical circuits increase. In addition, in the case where a clock signal is supplied through one delay adjusting circuit 117 to a plurality of logical circuits, the delays due to the respective paths cannot be individually adjusted.

Furthermore, the circuitry layout in the procedure described above is time-consuming and less efficient, since the routing is once carried out and thereafter it is repeatedly corrected so that a desirable delay control is achieved.

SUMMARY OF THE INVENTION

The object of the present invention is to provide a routing design method and a routing design apparatus, with which wire lengths are reduced and the delay control is carried out by the use of a minimum number of delay adjusting circuits, by considering parasitic components of wire resistances and wire capacitances before routing is completed.

A first routing design method of the present invention respectively includes the steps of (1) placing a first element serving as a source of a signal and second elements serving as destinations to which the signal is supplied, (2) determining prearranged paths from the first element to the second elements through which the signal is sent, and proposing relay spots along the paths based on predicted wire resistances and wire capacitances of wires to be provided on the prearranged paths, (3) obtaining regions where delay adjusting elements for adjusting delays in signal transmission through the prearranged paths are to be provided, the regions being obtained around the relay spots so as to have sizes in accordance with delays to be adjusted, and (4) providing wires between the first and second elements through the relay spots.

According to the above-described routing design method, relay spots are provided along prearranged paths on which wires are to be provided, and a routing design operation is carried out after regions where delay adjusting elements are provided are obtained around the relay spots. By doing so, in the case where the wire resistances and the wire capacitances after the routing is completed are different from those predicted when the relay spots are determined, sizes of the delay adjusting elements are determined in accordance with the wire resistances and the wire capacitances after the routing is completed, thereby causing influences due to differences in the wire resistances and the wire capacitances between before and after the wiring to be eliminated without replacement of the first and second elements and re-routing. Therefore, the delays set before the routing operation are kept unchanged. Besides, there is no need to provide the relay spots for delay control separately from the second elements as destinations of signals, thereby causing lengths of the wires provided therebetween to be reduced.

Therefore, not only efficiency of the routing design is enhanced, but also areas for the circuits thus designed and power consumption can be reduced.

The step (2) described above preferably includes the sub-steps of (a) proposing positions of the relay spots along the prearranged paths, and (b) evaluating, on each proposed position, to what degree delay control is achieved with respect to a target, and selecting at least one having the highest evaluation as a position at which the relay spot is actually provided. By this method, the delay control can be applied with respect to specific purposes such as decreasing delays, or equalizing respective delays occurring in the wires. Besides, since effectual relay spots each of which is given a high evaluation on the delay control are selected, the number of the relay spots actually provided is reduced so as to be minimum.

Therefore, a routing design which has higher degrees of freedom and less power consumption can be realized.

In the case where a plurality of proposed relay spots are given the highest evaluation, the proposed relay spot having the smallest size is preferably selected in the sub-step (b). By doing so, sizes of the regions obtained for the delay adjusting elements are reduced. Therefore, areas which the relay spots occupy can be limited.

The above-described routing design method further includes the step of computing wire densities based on the placement of the first and second elements, wherein in the step (3), regions having sizes in accordance with the wire densities are obtained. Therefore, it is possible to obtain regions having sizes which are determined by taking into consideration the wire capacitances depending on the wire densities. As a result, since the sizes of the regions are determined in accordance with the delays depending on the wire capacitances (hereinafter referred to as wire delays), the regions thus obtained have the minimum sizes.

In the step (2), the above-described routing design method preferably classifies the second elements into groups based on specific attributes, and determine prearranged paths between the first element and the respective groups on which wires are to be provided. Since the second elements are thus classified, a smaller number of the relay spots are determined, in comparison with the case wherein the relay spots are determined per second element even though the number of the second elements are increased. Therefore, the determining of the relay spots can be more effectually carried out.

Furthermore, in the above-described operation for classifying the second elements into groups, each group preferably has a load capacitance restricted so as not to exceed an allowable value. By doing so, in each group, a total length of wires can be decreased. Therefore, it is possible to limit a size of each group to such a degree as the wire delay can be neglected. As a result, the efficiency of the delay control can be enhanced.

It is preferable that the above described routing design method includes the steps of (5) extracting wire capacitances and wire resistances of the wires routed, and (6) determining delay adjusting elements satisfying given conditions concerning signal delays, based on the extracted wire capacitances and wire resistances, and inserting the delay adjusting elements in the relay spots.

With these steps, even in the case where the wire resistances and the wire capacitances are different from those predicted when the relay spots are determined, influences due to differences in the wire resistances and the wire capacitances between before and after the wiring can be eliminated without changes in the placement of elements and routing. Therefore, the delays set before the routing operation are kept unchanged.

Besides, since the delays are controlled with the insertion of the delay adjusting elements along the paths form the first element to the second elements, roundabout wires decrease, thereby causing a total capacitance of the signal transmission paths as a whole to decrease. Besides, there is no need to provide the delay adjusting elements inserted in the relay spots for delay control separately from the second elements, thereby causing lengths of the wires routed therebetween to be reduced. Therefore, not only efficiency of the routing is enhanced, but also areas for the circuit and power consumption can be reduced.

Furthermore, it is preferable that in the step (6), on each relay spot, to what degree delay control is achieved with respect to a target is evaluated based on the extracted wire resistances and wire capacitances, and a size of a delay adjusting element to be provided in the relay spot is determined based on the highest evaluation regarding the relay spot. By doing so, an optimal delay control can be applied with respect to specific purposes such as decreasing delays, or equalizing respective delays occurring in the wires.

Additionally, routing design apparatuses of the present invention are arranged so as to conduct routing design by the above-described respective routing design methods.

For a fuller understanding of the nature and advantages of the invention, reference should be made to the ensuing detailed description taken in conjunction with the accompanying drawings.

BRIEF DESCRIPTION OF THE DRAWINGS

FIG. 18 is a flowchart illustrating a conventional routing design process.

DESCRIPTION OF THE PREFERRED EMBODIMENTS

The following description will discuss an embodiment of the present invention, while referring to FIGS. 1 through 15.

Figure 5:
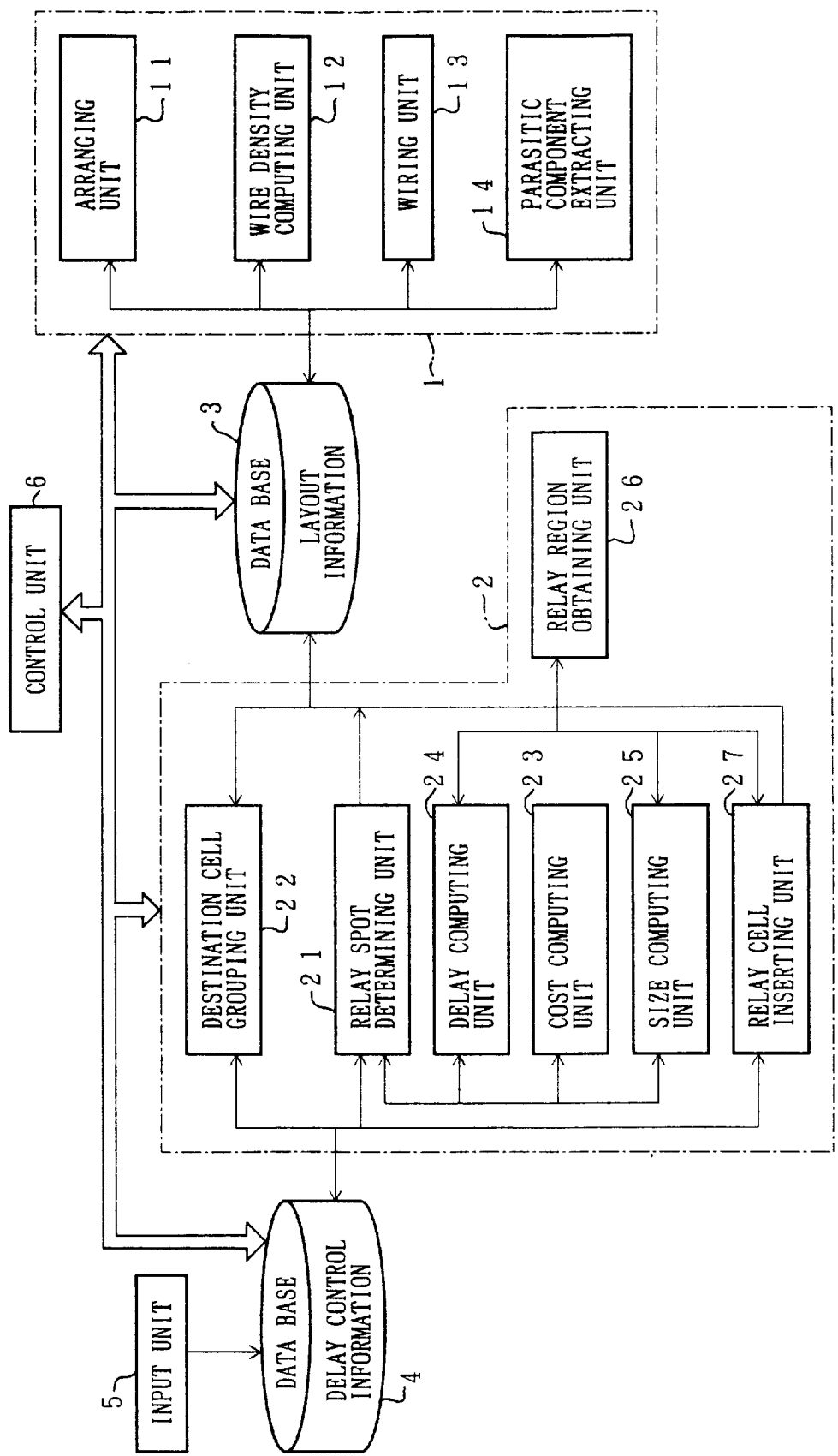
FIG. 5 is a block diagram illustrating an arrangement of the routing design apparatus.

A routing design apparatus of the present embodiment is provided with a routing system 1 and a relay spot insert system 2, as illustrated in FIG. 5. The routing system 1 deals with placement of cells (elements) and routing between cells, while the relay spot insert system 2, for conducting delay control, determines positions of relay spots (hereinafter referred to as relay positions) when global routing is carried out and inserts appropriate delay adjusting elements at the relay positions.

The above-mentioned cells are source cells from which signals are outputted and destination cells to which signals are supplied. The source cells are circuit elements for outputting synchronization signals such as clock signals, while the destination cells are minimum-unit circuit elements such as flip-flops operating in accordance with synchronization signals.

The routing design apparatus of the present embodiment also has a data bases 3 and 4, an input unit 5, and a control unit 6.

The data base 3 stores all the layout information necessary for placing and routing operations, including information on connection, routing, wire capacitances and wire resistances of the cells to which the placing and routing operations are applied.

The data base 4 stores all the information necessary for signal transmission delay control, including information on signals to which delay control is applied, information on a control method to be applied, information on a grouping operation of the destination cells, information on the positions and sizes of the relay spots, delay values at the destination cells. Such information is inputted in advance through the input unit 5 to the data base 4.

The control unit 6 controls operations by sections described later of the routing system 1 and the relay spot insert system 2, as well as controls input and output of data between the sections and the data bases 3 and 4.

The routing system 1 has a placement unit 11, wire density computing unit 12, a routing unit 13, and a parasitic component extracting unit 14.

The placement unit 11 determines positions of source cells and destination cells in accordance with information on placement and connection, by a usual method such as the simulated annealing (SA) method, the quadratic programming method, the Min-Cut method, or the pairwise interchanging method.

The wire density computing unit 12 conducts global routing in a routing region composed of a plurality of regions, between the cells whose positions are thus determined by the placement unit 11, in accordance with the information on placement and connection, and computes a wire density regarding each region.

In a routing process for a VLSI, the routing method is usually divided into two stages. According to the two-stage routing method, a global routing is determined by coarsely providing of routes, and a detailed routing is determined by transforming the rough routing result so as to satisfy design rules concerning relations between the wires and elements. With the above global routing, the whole region is divided into sub regions and which wire runs through which sub region is determined. By using this method, the wire density computing unit 12 finds how many wires run through each sub region.

The routing unit 13 routes wires between the cells in accordance with the information on the placement and connection, when regions where relay spots are provided (hereinafter referred to as relay regions) are determined and obtained by a relay region obtaining unit 26 which will be described later.

The parasitic component extracting unit 14 extracts parasitic capacitances (wire resistances, wire capacitances, etc.) in a state where the routing is completed.

The relay spot insert system 2 incorporates a relay spot determining unit 21, a destination cell grouping unit 22, a cost computing unit 23, a delay computing unit 24, a size computing unit 25, a relay region obtaining unit 26, and a relay cell inserting unit 27.

The relay spot determining unit 21 predicts and determines relay spots which provide optimal delay values, in accordance with results of computation by the wire density computing unit 12, the destination cell grouping unit 22, the cost computing unit 23, the delay computing unit 24, and the size computing unit 25. To be more specific, the following processing is carried out.

(21-1) Determine respective paths from the source cells to destination cell groups which are obtained by grouping (described later) of the destination cells by the destination cell grouping unit 22.

(21-2) Propose relay positions.

(21-3) Select those effective for delay control among the above relay positions thus proposed, and determine relay spots to be provided thereon.

The destination cell grouping unit 22 groups the destination cells in accordance with specific conditions (attributes) including a distribution of the destination cells and delay control conditions. The grouping operation is carried out, for example, in a manner illustrated in FIGS. 6(a) through 6(c).

Figure 6C:
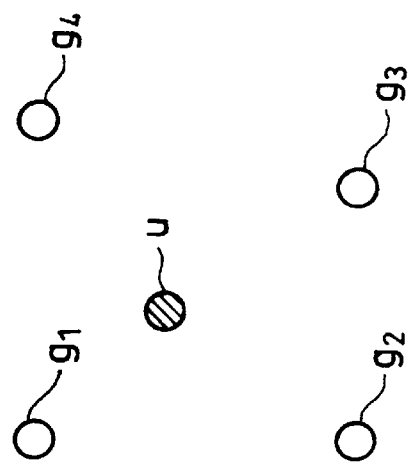
FIGS. 6(a) through 6(c) are views illustrating an operation for grouping destination cells through the above-described grouping process.
Figure 6A:
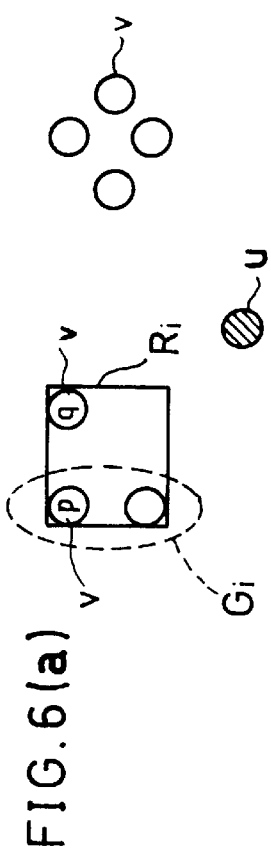
Figure 6B:
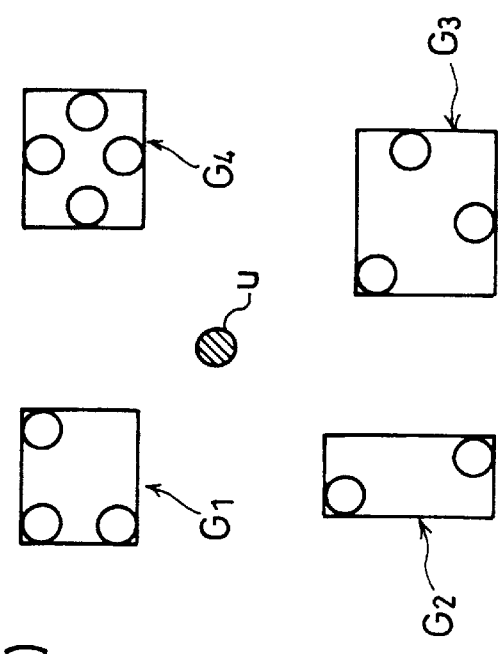
Figure 7:
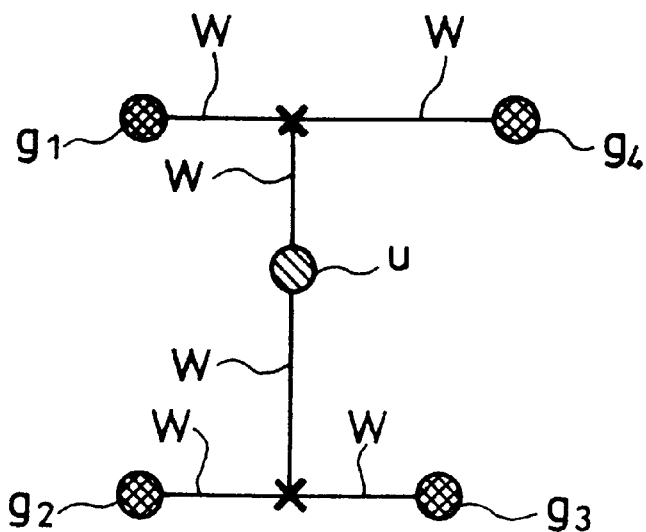
FIG. 7 is a view illustrating a state where wires are provided between the source cell and the groups.
Figure 8:
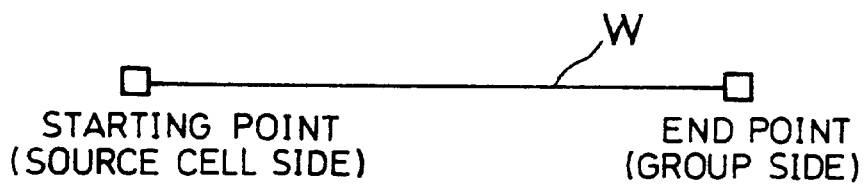
FIG. 8(a) is a view illustrating wire segments.
FIG. 8(b) is a view illustrating positions of proposed relay spots on the wire segments.
Figure 8:
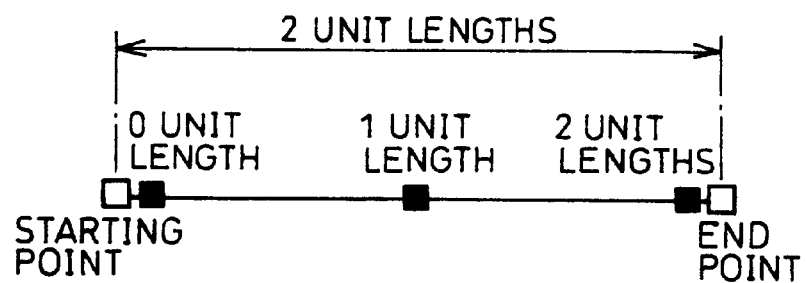
Figure 9A:
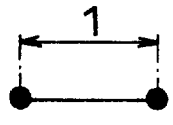
FIG. 9(a) is a wiring diagram illustrating a wire which is one unit length long.
Figure 9B:
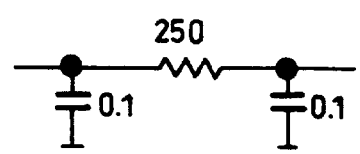
FIG. 9(b) is a circuit diagram illustrating a delay model of the wire illustrated in FIG. 9(a).

As illustrated in FIG. 6(a), in a region where a source cell u and a plurality of destination cells v are provided, one destination cell v is selected. A group $G_i$ (i=1) is formed by using this selected destination cell v, hereinafter referred to as an extracted cell p, as a seed of the group. As shown in FIG. 6(b), other groups $G_i$ (i=2, 3, 4) are also formed in the same manner, by using extracted cells p as respective nucleus. After the grouping is finished, the destination cells v are dealt with as groups $g_1$ through $g_4$, with each group as a unit, as illustrated in FIG. 6(c).

The following methods are applied for grouping the destination cells v, and an appropriate method is selected depending on distribution of the destination cells v.

(22-1) A method whereby the destination cell v closest to the source cell u is selected as an extracted cell p:

The destination cell v closest to the source cell u is selected as an extracted cell p, in the case where the destination cells v are biasedly placed in a region close to the source cell u. By this method, the destination cells v provided around the extracted cell p, that is, the destination cells v which are less affected by the wire delay are given priority in grouping. As a result, the destination cells v which are placed apart from the source cell u likely form their own groups, separately from the groups close to the source cell u.

(22-2) A method whereby the destination cell v farthest from the source cell u is selected as an extracted cell p:

In the case where the destination cells v are biasedly placed in a region far from the source cell u, the destination cell farthest from the source cell u is selected as an extracted cell p. By doing so, the destination cells v provided around the extracted cell p, that is, the destination cells v which are greatly affected by the wire delay, are given priority in grouping. As a result, the destination cells which are disposed apart from the source cell u and close to each other likely form their own groups.

(22-3) A method whereby one destination cell v is selected as an extracted cell p by the use of random numbers:

In the case where the destination cells v are uniformly placed with respect to the source cell u, one destination cell v is selected by the use of random numbers. By doing so, groups thus formed are not biasedly placed, and sizes of minimum rectangles $R_i$, each of which covers each group of the destination cells v, as illustrated in FIG. 6(a), do not greatly vary.

(22-4) A method whereby one destination cell v is selected as an extracted cell p in accordance with delay control conditions:

By this method, a destination cell v which has a particular requirement of delay control condition against the cell that is a member of the group already formed is selected as an extracted cell. By doing so, the destination cells which have a requirement of, for example, minimizing the difference in delays are given priority in forming a group.

As has been described, by using an optimal grouping method depending on distribution of the destination cells and delay control conditions, the effective delay control is enabled, whatever cell placement method is applied.

The cost computing unit 23 evaluates each relay positions proposed by the relay spot determining unit 21 by using cost formulas shown below, so as to select relay positions effective for the delay control among the above proposed relay positions. The cost formulas represent degrees to which delay control is achieved, and the smaller a cost value as a result of computation by the cost formula is, the higher evaluation is given to the proposed relay position.

Note that in the following cost formulas $d_{max}$, $d_{min}$, and F, represent a maximum delay from the source cell to the destination cells, a minimum delay from the source cell to the destination cells, and a cost value, respectively. Likewise, α, β, and γ represent constants, while S represents a sum of areas which the relay spots occupy.

$$F=d_{max}-d_{min} \tag{23-1}$$

By this cost formula, all the differences between delays in signal transmission to the destination cells (hereinafter referred to as delay differences between the destination cells) can be reduced.

$$F=(d_{max}-d_{min}) \times d_{min} \tag{23-2}$$

By this cost formula, all the delay differences between the destination cells can be reduced, and each delay can be decreased.

$$F=\alpha \times (d_{max}-d_{min})+\beta \times d_{min} \tag{23-3}$$

By this cost formula, in the case where priority is given either to (1) a requirement that delays are made equal to each other or (2) a requirement that each delay is decreased, it is possible to assign weights by properly setting α and β, so as to determine to what extent the priority is given to which requirement. For example, by increasing the value of α and by decreasing the value of β, the priority is given to decreasing delay dispersions, but the delays can be decreased in the case where the delays are equal.

$$F=\alpha \times (d_{max}-d_{min})+\beta \times d_{min}+\gamma \times S \tag{23-4}$$

By this cost formula, in addition to the effect of the cost formula (23-3), it is possible to control the number of relay spots. By increasing γ, the priority is given to a requirement that the sum of areas of relay spots is decreased, thereby avoiding an inconvenience that relay spots are unlimitedly provided.

It is also possible to consider control conditions between specific destination cells, by setting a cost formula using only delays between the specific destination cells. For example, in the case where only delay differences between specific destination cells are to be reduced, a cost formula using the specific delay differences should be used, thereby ensuring that delays are controlled with a smaller number of relay spots.

Thus, by properly setting cost formulas, the delay control is ensured under various conditions.

The delay computing unit 24 computes delays to be used in computation by the use of the cost formulas. The size computing unit 25 computes areas of relay spots, or sizes of delay adjusting elements to be provided in the relay spots. The areas, or the sizes, are used in computation by the use of the cost formulas.

The relay region obtaining unit 26 obtains regions (hereinafter referred to as relay regions) around the relay spots, for insertion of the delay adjusting elements (described later) at the relay spots determined by the relay spot determining unit 21. The sizes of the relay regions are determined depending on delays to be adjusted. To be more specific, the sizes of the relay regions are determined by adding margin for the delay adjustment after the routing to each of the areas of relay spots. In the case where a region to be obtained as a relay region is occupied by another cell, the relay region obtaining unit 26 moves the cell and obtains a relay region there, so as to ensure that a delay adjusting element can be inserted there.

When a delay adjusting element (cell) to be provided in the relay spot is finally determined, the relay cell inserting unit 27 inserts the cell in the relay spots.

The following description will discuss a procedure of the delay control by the routing design apparatus arranged as described above, while referring to the flowcharts of FIGS. 1 through 4.

First of all, the source cells and the destination cells are placed by the placement unit 11 (S1), and a global routing is provided and a density of wires is computed by the wire density computing unit 12 (S2). Since the wire capacitances vary with the wire densities, the wire densities should be found so that the relay region obtaining unit 26 obtains regions having sizes minimum with respect to the capacitances.

Subsequently, the relay spot determining unit 21 determines paths between the source cells and destination cells, and determines relay spots along the paths in accordance with results of computation by the destination cell grouping unit 22, the cost computing unit 23, the delay computing unit 24, and the size computing unit 25 (S3). After the relay spots are determined, the relay regions are obtained by the relay region obtaining unit 26 so that the delay adjusting elements are inserted in the relay spots thus determined (S4).

Thereafter, the routing unit 13 provides wires for transmission of signals to which the delay control is applied, in accordance with the routing which was determined through the process for determining the relay spots (S5). Subsequently, the other wires are also provided (S6). When the routing operations are finished, wire capacitances and wire resistances are detected as parasitic components by the parasitic component extracting unit 14 (S7).

Thereafter, respective parameters of the delay adjusting elements (cells) to be inserted in the relay spots are determined in accordance with the parasitic components and information on routing results which is stored in the data base 3 (S8). Then, delay adjusting elements, which have parameters identical to the above-described parameters, are selected from a library provided in the data base 4, and the delay adjusting elements thus selected are inserted in the relay spots (S9).

Figure 1:
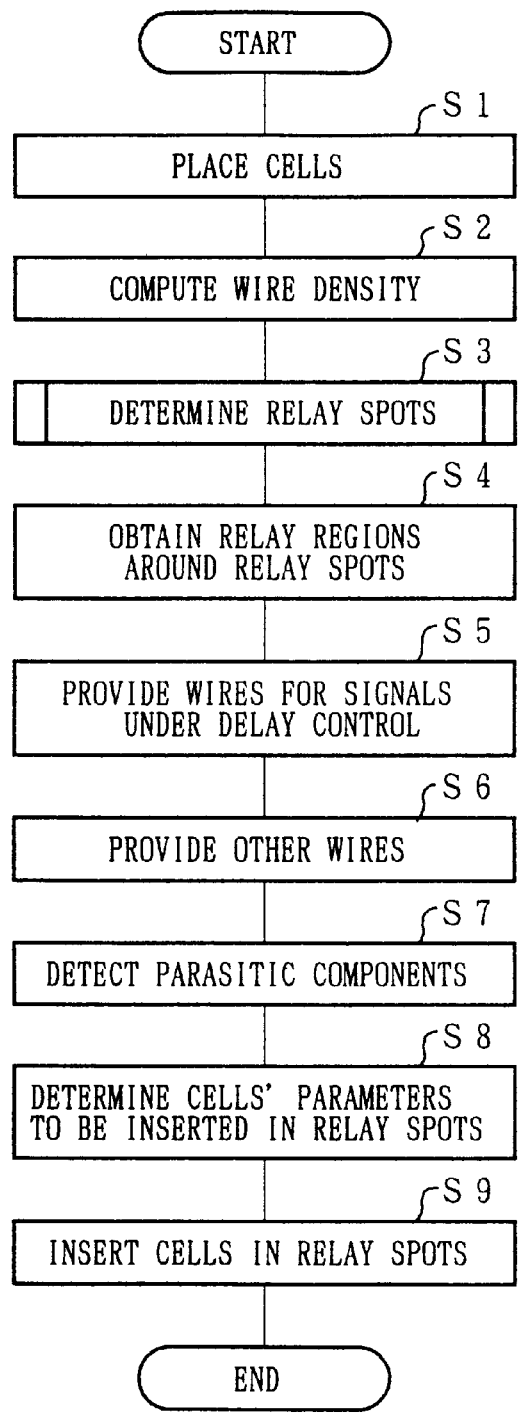
FIG. 1 is a flowchart illustrating a routing design process including delay control, in a routing design apparatus in accordance with an embodiment of the present invention.
Figure 2:
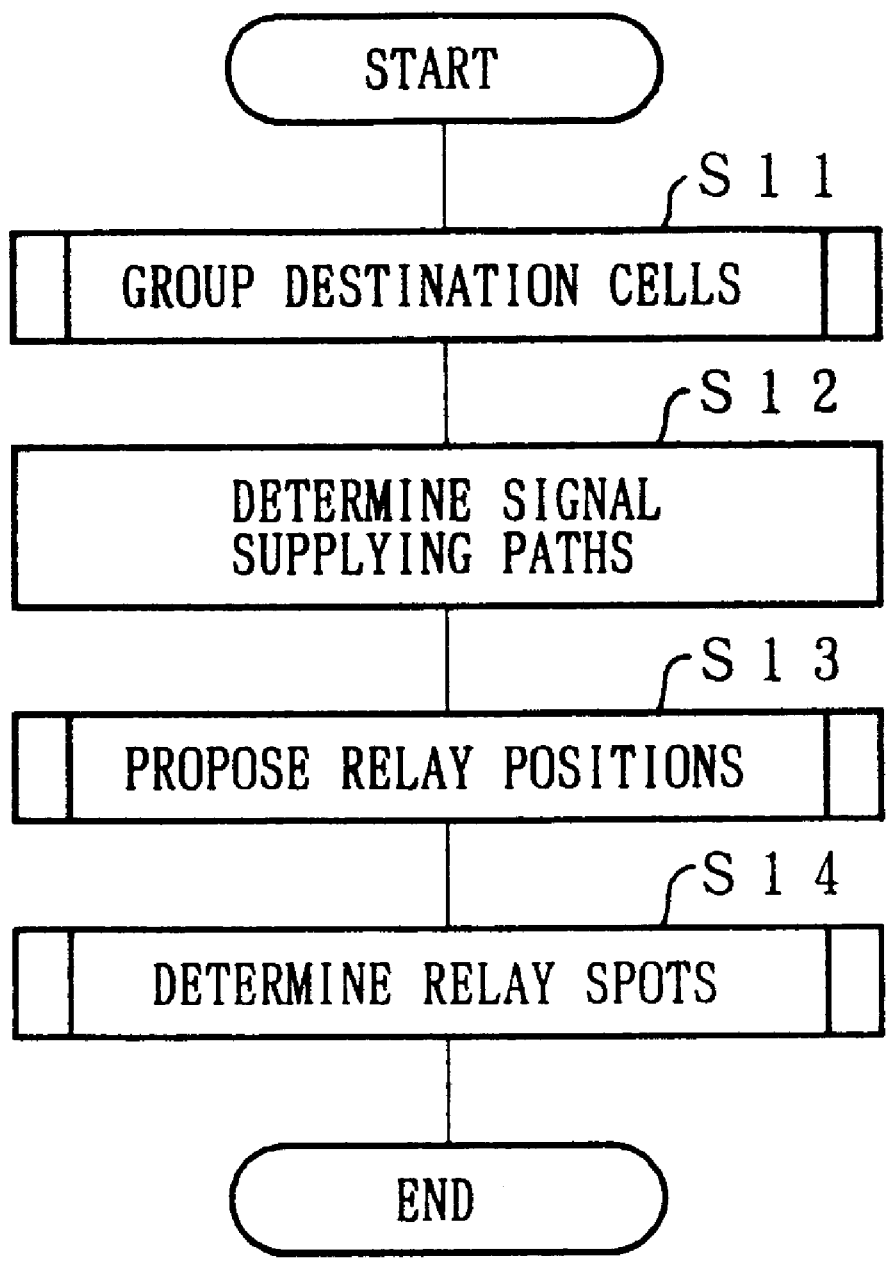
FIG. 2 is a flowchart illustrating a process for proposing relay spots, in the routing design process illustrated in FIG. 1.

Incidentally, the relay spots are determined in the step S3, through a process illustrated in a flowchart of FIG. 2.

First of all, the destination cells are grouped by the destination cell grouping unit 22 (S11). Then, paths from the source cells to the groups thus formed are determined by the relay spot determining unit 21 (S12), positions at which the relay spots may be provided are proposed (S13), and the relay spots are determined (S14).

Figure 3:
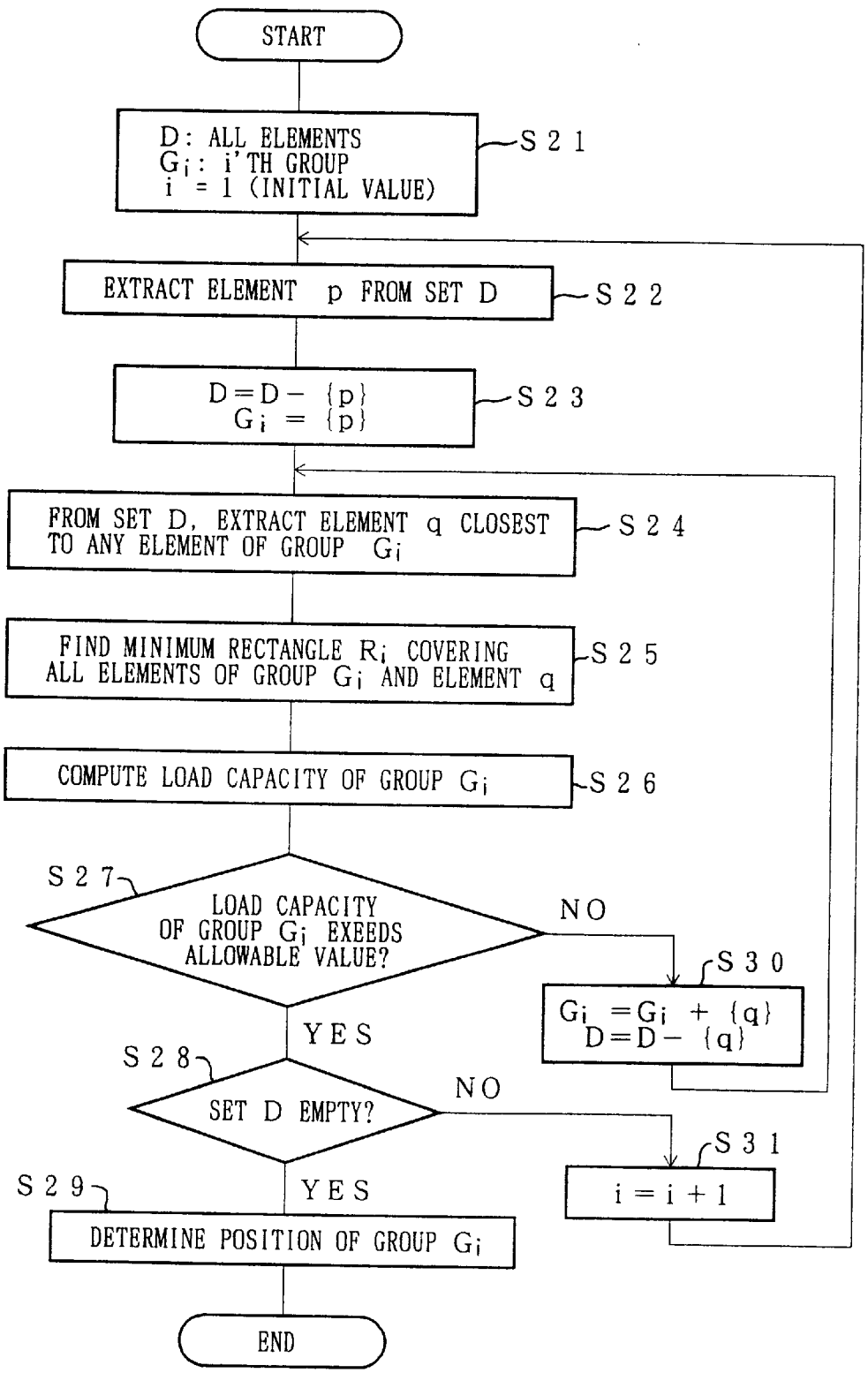
FIG. 3 is a flowchart illustrating a grouping process, in the relay spot proposing process illustrated in FIG. 2.
Figure 4:
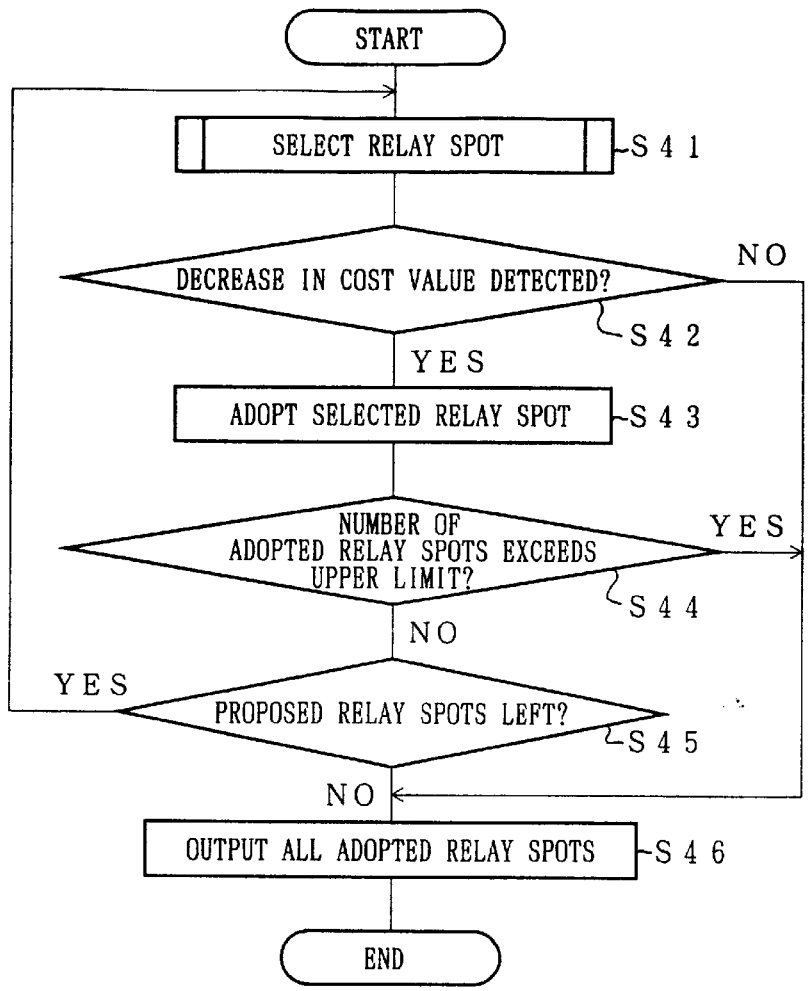
FIG. 4(a) is a flowchart illustrating a process for determining relay spots, in the relay spot proposing process illustrated in FIG. 2.
FIG. 4(b) is a flowchart illustrating a process for selecting relay spots, in the relay spot determining process as illustrated in FIG. 4(a).
Figure 4:
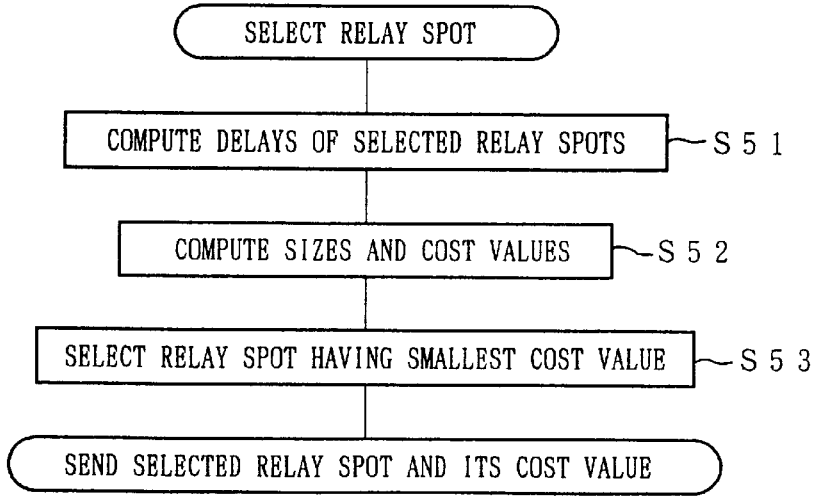

To be more specific about the grouping process, the grouping operations in the step S11 are carried out through the following process illustrated in the flowchart of FIG. 3. The process will be described in detail in the following description, while referring to FIGS. 6(a) through 6(c).

A set containing all the elements (destination cells) is given as D, an i'th group is given as $G_i$, and i is initialized to 1. Thus, the grouping operation is started with formation of a group $G_i$ (S21). As illustrated in FIG. 6(a), one element is extracted as an element p from the set D (S22), and the element p is subtracted from the set D, while the element p is added to the group $G_i$ as a seed of the group $G_i$ (S23).

Subsequently, distances from the group $G_i$ are measured with respect to the respective elements of the set D, and selected as an element q is an element which has the shortest distance among the distances between any element belonging to the set D and any element belonging to the group $G_i$ (S24). Here, selected is an element closest to the group $G_i$ under way for formation, which is encircled by a broken line in FIG. 6(a). Then, a minimum rectangle $R_i$ covering all the elements belonging to the group $G_i$ and the element q is obtained (S25). Here, a length of the perimeter of the rectangle $R_i$ is given as L.

Subsequently, a load capacitance of the group $G_i$ is computed (S26). The wire capacitance per unit length increases in a region having a high wire density since each space between wires is narrow, while the wire capacitance per unit length decreases in a region having a low wire density. Therefore, a wire capacitance per unit length is found by using the wire density which was previously found. Then, by adding the wire capacitance, a load capacitance is computed.

Furthermore, it is checked whether or not the load capacitance of the group $G_i$ exceeds a predetermined allowable value (S27). In the case where the load capacitance exceeds the predetermined allowance value, it is checked whether or not the set D is empty (S28). The allowance value, for example, is set to a value which limits the size of the group so that influences of differences in wire delays within the group can be neglected.

In the case where the set D is empty as illustrated in FIG. 6(b), this means that positions of all the groups have been determined (S29) and the group structure is completed. Thus, the process is finished. Here, each position of the groups is, as illustrated in FIG. 6(c), a center of gravity in the case where loads of the elements belonging to the group are considered as weight.

In the case where the load capacitance of the group $G_i$ does not exceed the allowable value in the step S27, the element q is added to the group $G_i$ and the element q is subtracted from the set D (S30), and the flow is returned to the step S24. On the other hand, in the case where the set D is not empty in the step S28, i is changed to i+1 (S31) so that the formation of the next group is started, and the flow is returned to the step S22.

As has been described, by dividing the set of the destination cells into groups so that in each of the groups delay differences can be neglected in light of accuracy, the efficiency of the subsequent relay spot inserting operations can be enhanced. Besides, since the size of each group is limited in accordance with the allowable value of the load capacitance, a length of wires provided within each group is restrained. Since wire lengths are thus restrained, the conventional control method for making the wire lengths uniform is allowed to be effectually applied to the routing inside each group. Furthermore, it is possible to combine the above described grouping method and the conventional wire length control method, so that accurate control is conducted within each group.

The following description will discuss in detail the step S13 for proposing the relay positions. First, all the wires provided from the source cell u to the groups $g_1$ through $g_4$ are divided into wire segments W by junctions indicated by × in FIG. 7. In other words, the routing consists of the wire segments W from the source cell u to the junctions and the wire segments W form the junctions to the groups $g_1$ through $g_4$. As illustrated in FIG. 8(a), regarding the ends of one wire segment W, the end closer to the source cell u is regarded as a starting point, while the other end is regarded as an end point.

Subsequently, between the starting point and the end point of each wire segment W, relay positions are proposed at every unit length (0, 1, 2, . . . ) from the starting point. For example, in the case where the wire segment W has 2 unit lengths between the starting point and the end point, as illustrated in FIG. 8(b), the proposed relay positions are respectively disposed at a position 0 unit length apart from the starting point, a position one unit length apart from the starting point, and a position two unit lengths apart from the starting point, which are indicated by ■ in the figure. Note that in the case where the proposed relay position to be disposed at a position 0 unit length apart from the starting point is actually disposed immediately behind the starting point. In the case where the proposed relay position to be disposed at a position 2 unit lengths apart from the starting point is actually disposed immediately before the end point.

The step S14 for determining relay spots is carried out through the process shown in the flowcharts of FIGS. 4(a) and 4(b).

First, as illustrated in FIG. 4(a), relay spots to be provided at the proposed relay positions are selected among proposed relay spots (the proposed relay positions) (S41) Here, as illustrated in FIG. 4(b) on each proposed relay spot, a delay is computed (S51) and a size of the relay spot is determined based on the delay thus found, while a cost value is computed using the cost formulas described above (S52). Then, one having the smallest cost value is selected as a prospective relay spot (S53), and the data on the prospective relay spot and its cost value are sent to the next step of the process.

Subsequently, it is checked whether or not the prospective relay spot selected this time has a smaller cost value then that of a relay spot adopted in the previous stage (S42), and the prospective relay spot is also adopted in the case where it has the smaller cost value (S43). Thereafter, it is checked whether or not the number of the selected relay spots exceeds the upper limit of the number of the relay spots (S44), and in the case where it does not exceed the upper limit, it is checked whether or not there are prospective relay spots left (S45). Here, in the case where no proposed relay spot is left, this means that all the relay spots are outputted (S46). Therefore, the process is completed.

In the case where no decrease in the cost value is detected in the step S42, it is considered that no more decrease is expected in the cost value. Therefore, the flow proceeds to the step S46. Likewise, in the case where the number of the selected relay spots exceeds the predetermined upper limit in the step S44, the flow proceeds to the step S46. Furthermore, in the case where it is found in the step S45 that the proposed relay spots are still left, the flow returns to the step S41.

Here, a method for calculating the delay in the step S51 will be concretely discussed in the following description.

The wiring can be expressed by an equivalent circuit diagram composed of resistance components and capacitance components. Here, in the case where a π model is used, a wire having a unit length 1 shown in FIG. 9(a) can be replaced with an equivalent circuit illustrated in FIG. 9(b). The equivalent circuit is composed of (1) one resistor having a resistance equivalent to the total wire resistance and (2) two capacitors each of which has a capacitance equivalent to half of the total wire capacitance and is connected to each end of the resistor. In this case, the given wire capacitance and wire resistance are 0.2 and 250 per unit length 1, respectively.

The wire resistance per unit length is substantially in inverse proportion to the wire width, while the wire capacitance per unit length is substantially in proportion to the wire width. In other words, it is possible to change the delay to some extent by providing means for changing the wire width. Therefore, the delay is controlled by changing the wire width, but in the present embodiment the wire width is fixed for conveniences sake.

Figure 10A:
FIG. 10(a) is a wiring diagram illustrating a wire having a buffer cell, the wire being one unit length long.
Figure 10B:
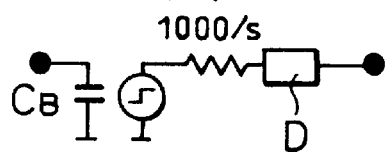
FIG. 10(b) is a circuit diagram illustrating a delay model of the wire illustrated in FIG. 10(a).

In the case where a buffer cell bs is inserted in the middle of a wire as illustrated in FIG. 10(a), the buffer cell bs is composed of transistors in a gate array or the like, and the size of the buffer cell bs depends on the size of the transistors. Besides, the size of the buffer cell bs is in inverse proportion to the resistance. Therefore, in a model wherein delays are calculated with resistances and the capacitances, the buffer cell bs is represented as a resistance which changes depending on a size s, and a load capacitance $C_B$. as illustrated in FIG. 10(b). A value of the resistance is obtained by dividing 1000 by a value of the size s ($1 \leq s \leq 10$) Here, 1000 is a value of the resistance when s=1.

Note that in the case where the load capacitance of the buffer cell bs is sufficiently small with respect to the wire capacitance, the load capacitance $C_B$ can be neglected. Likewise, in the case where a delay D (hereinafter referred to as inside delay D) inside the buffer cell bs is minute, the inside delay D can be neglected. In the following description, the load capacitance $C_B$ and the inside delay D are neglected for purposes of simplification, but the same effect as that in the case where they are neglected is obtained in the case where they are not neglected.

Figure 11A:
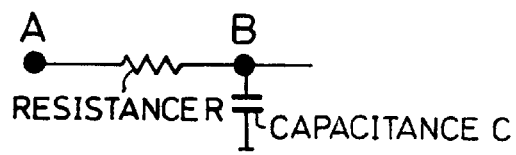
FIG. 11(a) is a circuit diagram illustrating a delay model in accordance with a wire resistance and a wire capacitance.
Figure 11B:
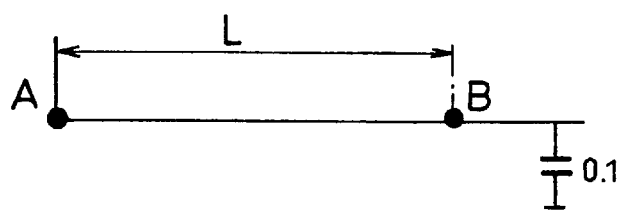
FIG. 11(b) is a circuit diagram illustrating a wire having a length L.
Figure 11C:
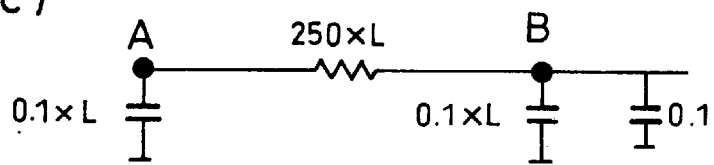
FIG. 11(c) is a circuit diagram illustrating an example wherein the above-mentioned delay model is applied to the wire illustrated in FIG. 11(b).

The following description will discuss an example of computation of the delay by the use of the equivalent circuit of the resistance and the capacitance. As illustrated in FIG. 11(a), in Elmore's model, the delay $d_{ab}$ between points A and B is represented as the product of a resistance R between the points A and B multiplied by a load capacitance C at the point B. For example, with application of the above-described model, a wire which has a length L and another wire having a load capacitance of 0.1, which are connected at the point B as illustrated in FIG. 11(b), can be equivalently expressed as a circuit as illustrated in FIG. 11(c). In the equivalent circuit, the total load capacity at the point B has a value obtained by adding the load capacitance (0.1) behind the point B and the wire capacitance (0.1×L) at the point B.

Therefore, the delay $d_{ab}$ of the equivalent circuit of the wire is found by the following calculation:

$$d_{ab} = R \times C$$
$$= (250 \times L) \times (0.1 \times L + 0.1)$$

Here, the delay $d_{ab}$ is 50 in the case where L=1, while it is 750 in the case where L=5.

Figure 12A:
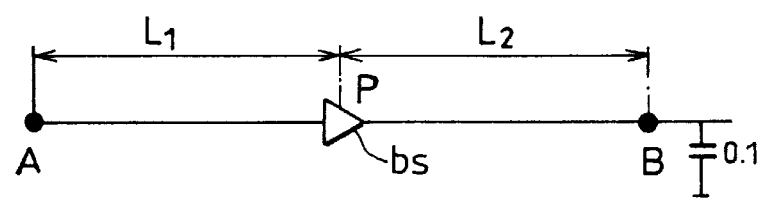
FIG. 12(a) is a circuit diagram illustrating a wire having a buffer cell.
Figure 12B:
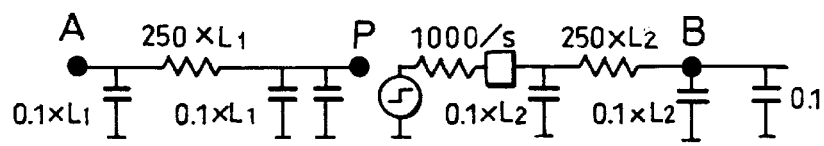
FIG. 12(b) is a circuit diagram illustrating a delay model in accordance with the wire resistance and capacitance of the wire illustrated in FIG. 12(a).

On the other hand, in the case where the buffer cell bs is inserted at a point P (provided so that a distance between the points A and P is $L_1$ while a distance between the points P and B is $L_2$) in the middle of a wire as illustrated in FIG. 12(a), the wire is equivalently expressed as a circuit illustrated in FIG. 12(b). A delay $d_{ap}$ between the points A and P and a delay $d_{pb}$ between the points P and B in this equivalent circuit are found by the following calculations:

$$d_{ap}=(250 \times L_1) \times (0.1 \times L_1)$$

$$d_{pb}=(1000/s) \times (0.1 \times L_2 \times 2 + 0.1) + (250 \times L_2) \times (0.1 \times L_2 + 0.1)$$

Here, $d_{ap}$=225 and $d_{pb}$=250 in the case where $L_1$=3, $L_2$=2, and s=5. Therefore, the delay $d_{ab}$ between the points A and B is found by the following calculation:

$$d_{ab}=d_{ap}+d_{pb}=225+250=475$$

As described above, the delay of a wire having 5 unit lengths without a buffer cell bs is 750, but the delay is decreased to 475 by providing a buffer cell bs at a position three unit lengths apart from the starting point (point A). In other words, the buffer cell bs inserted has an effect of controlling the delay. Therefore, the buffer cell bs can be utilized as a delay adjusting element.

Subsequently, the following description will discuss a concrete example of the method for determining relay spots through the above-described process.

Figure 13A:
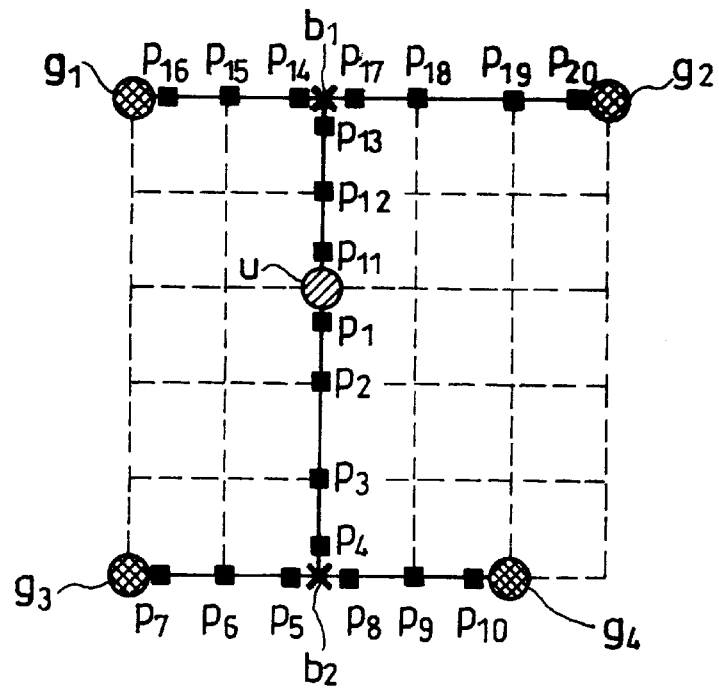
FIGS. 13(a) and 13(b) are views illustrating an example of the relay spot determining operation illustrated in FIGS. 4(a) and 4(b).

In a routing example illustrated in FIG. 13(a) a source cell u and groups $g_1$ through $g_4$ are provided. On wire segments between junctions $b_1$ and $b_2$ and the groups $g_1$ through $g_4$, relay spots $p_1$ through $p_{20}$ are proposed. Since FIG. 13(a) is a view illustrating the relay spots proposed in the first round of the relay determining operation, no relay spots have been adopted yet.

Figure 13B:
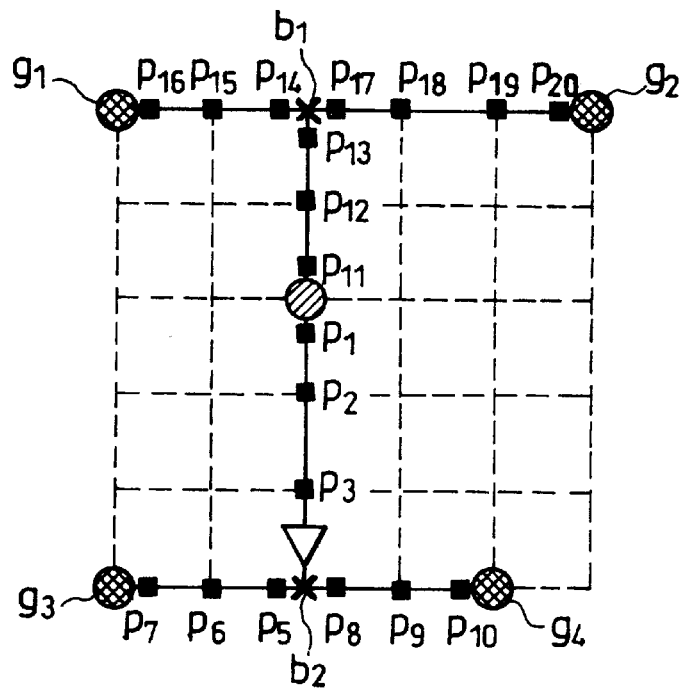

In this arrangement, each delay from the source cell u to the groups $g_1$ through $g_4$ in the case where each of the proposed relay spots $p_1$ through $p_{20}$ is adopted is calculated by the above-described method. According to a result of the calculation, the smallest cost value is obtained in the case with the proposed relay spot $p_3$ and in the case with the proposed relay spot $p_4$, as illustrated in Table 1 below. In these cases, the proposed relay spots $p_3$ and $p_4$ have sizes of 3.69 and 2.11, respectively. Thus, the propose d relay spot $p_4$ has the smaller size, and hence it is determined that the proposed relay spot $p_4$ is adopted, as illustrated in FIG. 13(b).

Note that the cost values shown in Table 1 are found by using the cost formula (23-2) which is described above.

TABLE 1

| | $g_1$ | $g_2$ | $g_3$ | $g_4$ | COST VALUE | SIZE(S) $1 \leq s \leq 10$ |
|---|---|---|---|---|---|---|
| NO RELAY SPOT | 850 | 1000 | 1125 | 1125 | 233750 | |
| $p_1$ | 850 | 1000 | 1125 + 1600/s | 1125 + 1600/s | 369750 | 10 |
| $p_2$ | 850 | 1000 | 775 + 1400/s | 775 + 1400/s | 127500 | 10 |
| $p_3$ | 850 | 1000 | 525 + 1200/s | 525 + 1200/s | 127500 | 3.69 |
| $p_4$ | 850 | 1000 | 375 + 1000/s | 375 + 1000/s | 127500 | 2.11 |
| $p_5$ | 850 | 1000 | 750 + 500/s | 750 | 187500 | 10 |
| * | | | | | | |
| * | | | | | | |
| * | | | | | | |
| $p_{11}$ | 850 + 1600/s | 1000 + 1600/s | 1125 | 1125 | 151500 | 10 |
| $p_{12}$ | 500 + 1400/s | 650 + 1400/s | 1125 | 1125 | 146250 | 2.95 |

TABLE 1-continued

| | $g_1$ | $g_2$ | $g_3$ | $g_4$ | COST VALUE | SIZE(S) $1 \leq s \leq 10$ |
|---|---|---|---|---|---|---|
| $p_{13}$ | 250 + 1200/s | 400 + 1200/s | 1125 | 1125 | 146250 | 1.66 |
| $p_{14}$ | 600 + 500/s | 750 | 1125 | 1125 | 281250 | 3.33 |
| * | | | | | | |
| * | | | | | | |
| * | | | | | | |
| $p_{17}$ | 500 | 1000 + 1600/s | 1125 | 1125 | 312500 | 10 |
| * | | | | | | |
| * | | | | | | |
| * | | | | | | |

The following description will depict in detail the calculation on the adopted relay spot $p_4$. In the following calculation, the wire capacitance per unit length is 0.2 (=0.1+0.1), the wire resistance per unit length is 250, and the groups $g_1$ through $g_4$ has a load capacitance of 0.1 each.

Since a load capacitance behind the junction $b_1$ is 0.2× 5+0.1+0.1, a delay $d_{ub1}$ between the source cell u and the junction $b_1$ is found by the following calculation:

$$d_{ub1} = 250 \times 2 \times (0.2 \times 2/2 + 0.2 \times 5 + 0.1 + 0.1)$$

$$= 500 \times 1.4 = 700$$

A delay $d_{b1g1}$ between the junction $b_1$ and the group $g_1$, and a delay $d_{b1g2}$ between the junction $b_1$ and the group $g_2$ are found, respectively, by the following calculations:

$$d_{b1g1} = 250 \times 2 \times (0.2 \times 2/2 + 0.1)$$

$$= 500 \times 0.3 = 150$$

$$d_{b1g2} = 250 \times 3 \times (0.2 \times 3/2 + 0.1)$$

$$= 750 \times 0.4 = 300$$

Therefore, a delay $d_{ug1}$ between the source cell u and the group $g_1$ and a delay $d_{ug2}$ between the source cell u and the group $g_2$ are found, respectively, by the following calculations:

$$d_{ug1}=700+150=850$$

$$d_{ug2}=700+300=1000$$

On the other hand, a delay $d_{up4}$ between the source cell u and the proposed relay spot $p_4$ is found by the following calculations:

$$d_{up4} = 250 \times 3 \times (0.2 \times 3/2)$$

$$= 750 \times 0.3 = 225$$

A delay $d_{p4b2}$ between the proposed relay spot $p_4$ and the junction $b_2$ is found by the following calculation:

$$d_{p4b2} = (1000/s) \times (0.2 \times 4 + 0.1 + 0.1)$$

$$= (1000/s) \times 1.0 = 1000/s$$

since it is considered that the buffer cell bs described above is provided in the proposed relay spot $p_4$ and a load capacitance behind the junction $b_2$ is 0.2×4+0.1+0.1.

A delay $d_{b2g3}$ between the junction $b_2$ and the group $g_3$ and a delay $d_{b2g4}$ between the junction $b_2$ and the group $g_4$ are found, respectively, by the following calculations:

$$d_{b2g3} = 250 \times 2 \times (0.2 \times 2/2 + 0.1)$$

$$= 500 \times 0.3 = 150$$

$$d_{b2g4} = 250 \times 2 \times (0.2 \times 2/2 + 0.1)$$

$$= 500 \times 0.3 = 150$$

Therefore, a delay $d_{ug3}$ between the source cell u and the group $g_3$ and a delay $d_{ug4}$ between the source cell u and the group $g_4$ are found, respectively, by the following calculations:

$$d_{ug3} = 225 + 1000/s + 150$$

$$= 375 + 1000/s$$

$$d_{ug4} = 225 + 1000/s + 150$$

$$= 375 + 1000/s$$

The following calculation is carried out so as to find a size s by using the delays thus found.

Given that $d_{ug3}$ (=$d_{ug4}$)=d, a range of the value d is given as $475 \leq d \leq 1375$, since the size s has a specific range of $1 \leq s \leq 10$. Therefore, a cost value F obtained by using the cost formula (23-2) is found as follows.

(A) Since $d_{max}$=1000 and $d_{min}$=850 in the case where $850 \leq d \leq 1000$, the cost value F is found by the following calculations:

$$F=(1000-850) \times 850=127500$$

(B) Since $d_{max}$=1000 in the case where $475 \leq d < 850$, the cost value F is found by the following calculations:

$$F=(1000-d) \times d > 127500$$

This expression expresses a parabola, which is convex upward and has a symmetry axis given as d=500. Therefore, the cost value F becomes minimum when d is approximately 850, that is, farthest from the symmetry axis.

(C) Since $d_{min}$=850 in the case where $1000 < d \leq 1375$, the cost value F is found by the following calculations:

$$F=(d-850) \times 850 > (1000-850) \times 850=127500$$

Therefore, in the case (A), the cost value F is minimum. In this case, the size s is given so that a difference between $d_{min}$ and d is minimum and s satisfies $850 \leq 375+1000/s \leq 1000$. Therefore, s is a value which satisfies $375+1000/s=850$, that is, about 2.11.

Subsequently, delays are calculated with respect to all the proposed relay spots $p_1$ through $P_{20}$ other than the adopted relay spot $p_4$, that is, the relay spots $p_1$ through $p_3$ and $p_5$ through $p_{20}$. As a result of the calculation, the relay spot $p_{15}$ has a minimum cost value, as illustrated in Table 2, and a size s of the relay spot $p_{15}$ is found to be about 1.33. Here, a cost value of the relay spot $p_{15}$ is found to be 0. Therefore, a decrease in the cost value is by no means detected regarding a relay spot selected in the next stage. As a result, through the judgement of the step S42 of the FIG. 4(a), the relay spots $p_4$ and $p_{15}$ are outputted as adopted relay spots.

TABLE 2

| | $g_1$ | $g_2$ | $g_3$ | $g_4$ | COST VALUE | SIZE(S) $1 \leq s \leq 10$ |
|---|---|---|---|---|---|---|
| NO RELAY SPOT | 850 | 1000 | 850 | 850 | | |
| $p_1$ | | | | | | |
| * | | | | | | |
| * | | | | | | |
| * | | | | | | |
| $p_{12}$ | 500 + 1400/s | 650 + 1400/s | 850 | 850 | 105000 | 7 |
| $p_{13}$ | 250 + 1200/s | 400 + 1200/s | 850 | 850 | 105000 | 2.67 |
| $p_{14}$ | 600 + 500/s | 750 | 850 | 850 | 75000 | 3.33 |
| $p_{15}$ | 625 + 300/s | 850 | 850 | 850 | 0 | 1.33 |
| $p_{16}$ | 750 + 100/s | 950 | 850 | 850 | 85000 | 1 |
| $p_{17}$ | 500 | 620 + 700/s | 850 | 850 | 175000 | 3.5 |
| $p_{18}$ | 600 | 625 + 500/s | 850 | 850 | 150000 | 2.22 |
| $p_{19}$ | 700 | 700 + 300/s | 850 | 850 | 105000 | 2 |
| $p_{20}$ | 800 | 875 + 100/s | 850 | 850 | 68000 | 10 |

Regarding the step S8 (FIG. 1), the parameters of the cells to be inserted in the relay spots are determined as follows. Note that in the case where the parasitic components (wire capacitance and wire resistance) extracted by the parasitic component extracting unit 14 are equal to those predicted during the relay spot determining process, the sizes of the relay spots are used as respective parameters of the cells.

Figure 14:
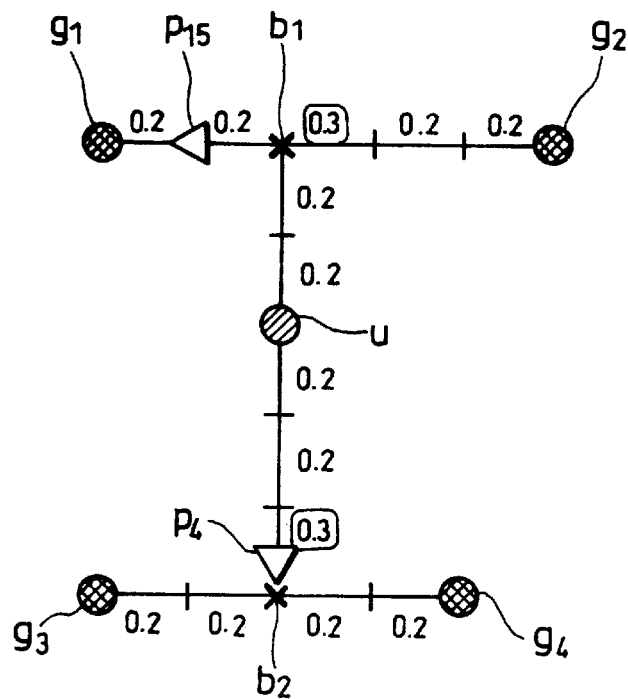
FIG. 14 is an example of an operation for determining sizes of delay adjusting elements in the case where wire capacitances are different from predicted values.

A case wherein wire capacitances are different from those predicted during the relay spot determining process is illustrated in FIG. 14. In this case, wire capacitances per unit length in the vicinity of a junction $b_1$ and a relay spot $p_4$ in the routing, which are 0.3 each, are greater than predicted wire capacitances, which are 0.2 each. Note that wire resistances and respective capacitances of the groups are equal to those predicted. Sizes of cells inserted in the relay spots $p_4$ and $p_{15}$ are given as $s_1$ and $s_2$, respectively.

Respective delays $d_1$ through $d_4$ between the source cell u and the groups $g_1$ through $g_4$ in the above case are found as follows:

$$d_1=675+300/s_2$$

$$d_2=912.5$$

$$d_3=437.5+1000/s_1$$

$$d_4=437.5+1000/s_1$$

Here, by using the above-described formula (23-2), $s_1$ and $s_2$ with which a minimum cost value F can be obtained are found to be about 2.10 and about 1.26, respectively. In this case, the cost value becomes 0, while each of the delays with respect to the groups $g_1$ through $g_4$ is 912.5.

Thus, by inserting cells whose sizes are thus determined into the relay spots $p_4$ and $p_{15}$, it is possible to control delays as designed even though the actual wire capacitances are different from those predicted.

Besides, in the case where wire resistances are different from those predicted, it is also enabled to conduct the delay control as designed, by calculating delays with respect to the groups $g_1$ through $g_4$ in the same manner as above, and finding the sizes of the cells to be inserted which cause the cost values to be minimum (or maximum). Alternatively, instead of the cost formula used so as to find the minimum cost value, another evaluation formula may be used such that the maximum value obtained by computation by the use of the formula is given the highest evaluation. By the use of such evaluation formula, it is enabled to conduct the delay control as designed by finding a size of a cell with which a computation result becomes maximum.

Note that in the processes shown in FIGS. 4(a) and 4(b), the evaluation formula such that the maximum value obtained by computation by the use of the formula is given the highest evaluation may be used so as to realize the delay control, instead of the cost formula for obtaining the minimum cost value. To be more specific, in the step S42 it is checked whether or not an increase is observed in the cost values, and in the step S53 one having the maximum cost value is selected.

Figure 15:
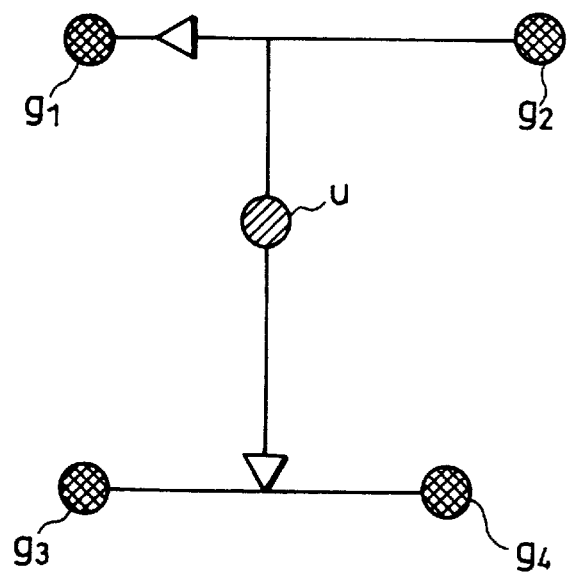
FIG. 15 is a view illustrating a routing design completed through the process illustrated in FIG. 1.
Figure 16:
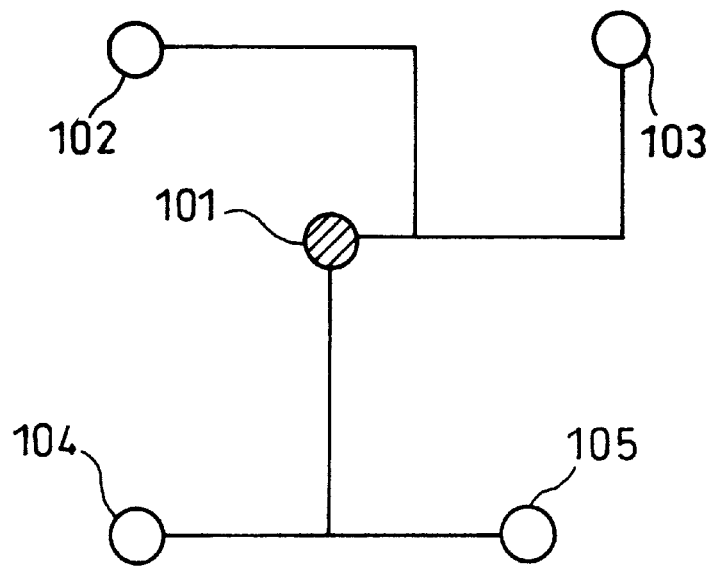
FIG. 16 is a view illustrating a conventional routing design.
Figure 17:
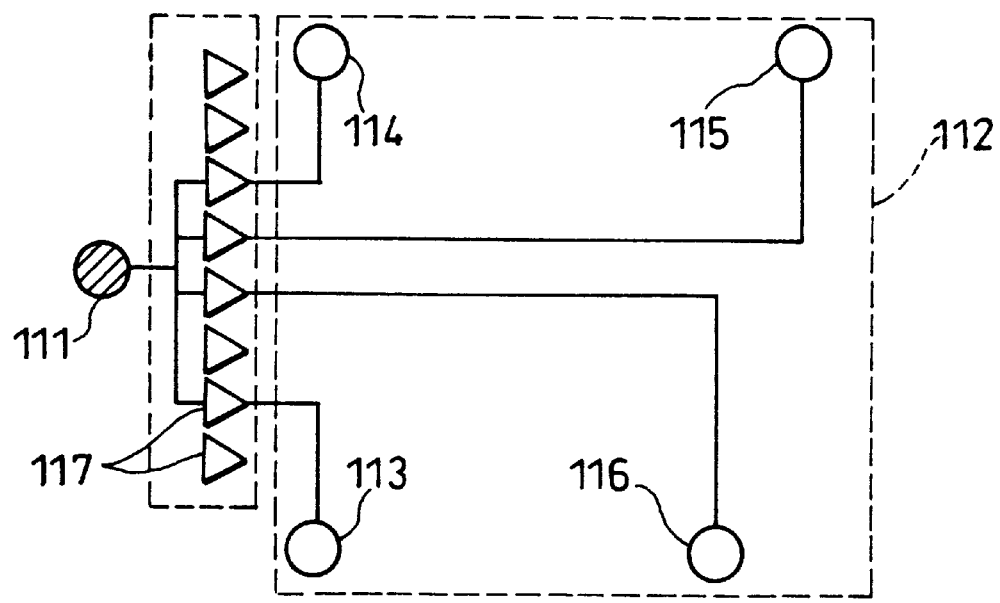
FIG. 17 is a view illustrating another conventional routing design.

As has been described, according to the method and apparatus of the present invention, sizes of relay spots (cells to be inserted) provided before routing are determined after a routing design is completed. Therefore, a delay control can be conducted with influences of the completed routing (placement and routing) being taken into consideration, without re-routing, as illustrated in FIG. 15.

Besides, buffer cells (delay adjusting elements) are provided so that the delay control is conducted, thereby ensuring that less roundabout wires are provided.

In addition, the relay spots (buffer cells) for conducting the delay control are provided not separately from the destination cells to which control is applied, thereby ensuring that wires provided therebetween do not increase.

Furthermore, wire densities are found in advance, and during an operation for obtaining regions where the relay spots are provided, minimum sizes which the regions need to have can be found by the use of the wire densities. Therefore, it is ensured that the relay spots have smaller sizes. Besides, the wire densities can be utilized in calculating respective load capacitances of groups during a grouping operation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A routing design method, comprising the steps of:
   (1) placing a first element serving as a source of a signal and second elements serving as destinations to which the signal is supplied;
   (2) determining prearranged paths from the first element to the second elements through which the signal is sent, and proposing relay spots along the paths based on predicted wire resistances and wire capacitances of wires to be provided on the paths, where at least some relay spots are at positions in the paths free of junctions to other paths;
   (3) obtaining regions where delay adjusting elements for adjusting delays in signal transmission through the prearranged paths are provided, the regions being obtained around the relay spots so as to have sizes in accordance with delays to be adjusted;
   (4) providing wires between the first and second elements through the relay spots;
   (5) extracting wire capacitances and wire resistances of the wires provided; and
   (6) after steps (1) to (5), determining delay adjusting elements satisfying given conditions concerning signal delays, based on the extracted wire capacitances and wire resistances, and inserting the delay adjusting elements in the relay spots.

2. The routing design method as set forth in claim 1, wherein said step (2) includes the sub-steps of:
   (a) proposing positions of the relay spots along the prearranged paths; and
   (b) evaluating, on each proposed position, to what degree delay control is achieved with respect to a target, and selecting at least one having the highest evaluation as a position at which the relay spot is actually provided.

3. The routing design method as set forth in claim 2, wherein in said step (b), among a plurality of the proposed positions having the highest evaluation, one at which a relay spot having the smallest size is provided is selected as a position at which the relay spot is actually provided.

4. A routing design method as set forth in claim 1, further comprising the step of:
   (7) computing wire densities based on the placement of the first and second elements by said step (1), said step (7) being carried out between said steps (1) and (3),
   wherein in said step (3), regions having sizes in accordance with the wire densities are obtained.

5. The routing design method as set forth in claim 1, wherein said step (2) includes the sub-step of:
   (a) classifying the second elements into groups where each group has a seed, and each seed is a second element previously designated as the seed in accordance with one of a plurality of orders of priority, and
   (b) determining prearranged paths between the first element and the respective groups on which wires are provided.

6. The routing design method as set forth in claim 5, wherein in said sub-step (a), each group has a load capacitance restricted so as not to exceed an allowable value.

7. The routing design method as set forth in claim 1, wherein in said step (6), on each relay spot, to what degree delay control is achieved with respect to a target is evaluated based on the extracted wire resistances and wire capacitances, and a size of a delay adjusting element to be provided in the relay spot is determined based on the highest evaluation regarding the relay spot.

8. A routing design apparatus, comprising:
   placement means for a first element serving as a source of a signal and second elements serving as destinations to which the signal is supplied;
   relay spot determining means for determining prearranged paths from the first element to the second elements through which the signal is sent, and proposing relay spots along the paths, including spots away from path junctions, where the spots are based on predicted wire resistances and wire capacitances of wires to be provided on the paths;
   region obtaining means for obtaining regions where delay adjusting elements for adjusting delays in signal transmission through the prearranged paths are provided, the regions being obtained around the relay spots so as to have sizes in accordance with delays to be adjusted;

routing means for providing wires between the first and second elements through the relay spots;

extracting means for extracting wire capacitances and wire resistances of the wires provided; and inserting means for determining delay adjusting elements satisfying given conditions concerning signal delays, based on the extracted wire capacitances and wire resistances, and inserting the delay adjusting elements in the relay spots.

9. The routing design apparatus as set forth in claim 8, wherein said relay spot determining means proposes positions of the relay spots along the prearranged paths, evaluates, on each proposed position, to what degree delay control is achieved with respect to a target, and selects at least one having the highest evaluation as a position at which the relay spot is actually provided.

10. The routing design apparatus as set forth in claim 9, wherein in the case where a plurality of the proposed positions having the highest evaluation exist, said relay spot determining means selects a position at which a relay spot having the smallest size is provided, as a position at which the relay spot is actually provided.

11. A routing design apparatus as set forth in claim 8, further comprising wire density computing means for computing wire densities based on the placement of the first and second elements by said placement means, wherein said region obtaining means obtains regions having sizes in accordance with the wire densities.

12. The routing design apparatus as set forth in claim 8, wherein said relay spot determining means groups the second elements into a plurality of groups and each of said groups having a second element previously designated as a seed, the designation of the seed is in accordance with a selected one of a plurality of orders of seed priority, and determines prearranged paths between the first element and the respective groups on which wires are provided.

13. The routing design apparatus as set forth in claim 12, wherein said relay spot determining means classifies the second elements into groups so that each group has a load capacitance not exceeding an allowable value.

14. The routing design apparatus as set forth in claim 8, wherein said inserting means evaluates, on each relay spot, to what degree delay control is achieved with respect to a target based on the extracted wire resistances and wire capacitances, and determines a size of a delay adjusting element to be provided in the relay spot based on the highest evaluation regarding the relay spot.

15. A recording medium having a routing design program, said program comprising the steps of:

(1) placing a first element serving as a source of a signal and second elements serving as destinations to which the signal is supplied;

(2) determining prearranged paths from the first element to the second elements through which the signal is sent, and proposing relay spots along the paths based on predicted wires resistances and wire capacitances of wires to be provided on the paths, where at least some of the spots are free of path junctions;

(3) obtaining regions where delay adjusting elements for adjusting delays in signal transmission through the prearranged paths are provided, the regions being obtained around the relay spots so as to have sizes in accordance with delays to be adjusted;

(4) providing wires between the first and second elements through the relay spots;

(5) extracting wire capacitances and wire resistances of the wires provided; and (6) after steps (1) to (5), determining delay adjusting elements satisfying given conditions concerning signal delays, based on the extracted wire capacitances and wire resistances, and inserting the delay adjusting elements in the relay spots.

* * * * *